(12) United States Patent
Ohno

(10) Patent No.: US 6,847,120 B2
(45) Date of Patent: Jan. 25, 2005

(54) FLIP CHIP SEMICONDUCTOR DEVICE HAVING SIGNAL PADS ARRANGED OUTSIDE OF POWER SUPPLY PADS

(75) Inventor: Tsuyoshi Ohno, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/024,154

(22) Filed: Dec. 18, 2001

(65) Prior Publication Data
US 2002/0113319 A1 Aug. 22, 2002

(30) Foreign Application Priority Data
Dec. 21, 2000 (JP) ........................................ 2000-389519

(51) Int. Cl.[7] .............................................. H01L 23/52
(52) U.S. Cl. .................... 257/778; 257/786; 257/691; 257/210; 257/207
(58) Field of Search ................................ 257/784, 786, 257/691, 778, 203, 207, 208, 210

(56) References Cited

U.S. PATENT DOCUMENTS 5,952,726 A * 9/1999 Liang ......................... 257/778
6,097,098 A * 8/2000 Ball ............................ 257/691
6,229,099 B1 * 5/2001 Horiuchi et al. ............. 174/260
6,335,493 B1 * 1/2002 Horiuchi et al. ............. 174/260
6,388,199 B1 * 5/2002 Jiang et al. .................. 174/255
6,410,990 B2 * 6/2002 Taylor et al. ................ 257/207

FOREIGN PATENT DOCUMENTS

JP    05-267302     10/1993
JP    2000-100955    4/2000

* cited by examiner

Primary Examiner—Nathan J. Flynn
Assistant Examiner—Pershelle Greene
(74) Attorney, Agent, or Firm—Katten Muchin Zavis Rosenman

(57) ABSTRACT

A flip chip semiconductor device has a cell forming layer assigned to macro-cells and input and output cells and a pad forming layer assigned to power supply pads for the macro-cells and input and output cells and signal pads for the input and output cells, and the signal pads are arranged outside of the power supply pads, whereby a package substrate to be assembled with the flip chip semiconductor device is simplified by virtue of the signal lines on a level with the signal pads, because any power supply pad is not an obstacle against the signal lines.

30 Claims, 16 Drawing Sheets

FLIP CHIP SEMICONDUCTOR DEVICE HAVING SIGNAL PADS ARRANGED OUTSIDE OF POWER SUPPLY PADS

FIELD OF THE INVENTION

This invention relates to a semiconductor device and, more particularly, to a flip chip semiconductor device to be bonded to a multi-layered circuit board.

DESCRIPTION OF THE RELATED ART

The flip chip semiconductor device is preferable for an integrated circuit with more than a thousand pins, and a typical example of the application is a high-speed interface in a large power consumption electronic system. When manufacturers develop the flip chip semiconductor devices, the manufacturers attach more importance to the performance rather than the cost. For this reason, the flip chip semiconductor devices are more costlier than other kinds of semiconductor devices. Thus, the flip chip semiconductor devices achieve high performance at the sacrifice of the cost. Nevertheless, the manufacturers find a great demand for the flip chip semiconductor devices. This is because of the fact that the users require high performance semiconductor devices for multi-functional high speed electronic systems. In fact, the manufacturers are increasing the production of the flip chip semiconductor devices. In this situation, research and development efforts are being made for the flip chip semiconductor devices with an emphasis put on the cost as well as the performance.

A typical example of the flip chip semiconductor device is disclosed in Japanese Patent Application laid-open No. 5-267302. FIG. 1 shows the layout on the prior art flip chip semiconductor device disclosed in the Japanese Patent Application laid-open. Reference numeral 171 designates the prior art flip chip semiconductor device. The prior art flip chip semiconductor device includes small-capacity input and output cells 174, logic cell blocks 175, large-capacity input and output cells 176 and gate arrays 182. The peripheral portion of a bump electrode forming area 180 is assigned to the large-capacity input and output cells 176, and the large-capacity input and output cells 176 are connected to bump electrodes 173 formed in the peripheral area. On the other hand, the internal portion 181 of the electrode forming area 180 is assigned to the small-capacity input and output cells 174, and are mixed with the gate arrays 182 in the logic cell blocks 175. Since the gate arrays 182 are designed to occupy areas as narrow as those occupied by the small-capacity input and output cells 174, the bump electrodes 173 are uniformly arranged at regular pitches in the bump electrode forming area 180. The Japanese Patent Application laid-open teaches that area bumps are employed in the prior art flip chip semiconductor device. However, the Japanese Patent Application laid-open is silent to how the power supply bumps and signal bumps are arranged.

In the process for fabricating the prior art flip chip semiconductor device, the prior art flip chip semiconductor device is bonded to a package substrate or a multi-layered substrate, which has a front surface to be connected to the pads formed on the pad forming area of the flip chip and a reverse surface formed with electrodes. The prior art flip chip semiconductor device does not permit the manufacturer to reduce the number of wiring layers, and the cost is still high. Thus, the prior art flip chip semiconductor device is not conducive to the reduction in the system cost. The manufacturer does not take the positional relation between the input and output cells and the power voltage units for the input and output cells into account so that the designer feels it difficult to route the power supply lines in the internal area.

Another prior art flip chip semiconductor device is disclosed in Japanese Patent Application laid-open No. 2000-10955. FIG. 2 shows the layout on the prior art flip chip semiconductor device disclosed in the Japanese Patent Application laid-open. Reference numeral 191 designates the prior art flip chip semiconductor device. The prior art flip chip semiconductor device has an inner region 193 and a peripheral region around the inner region. Function blocks are formed in the inner region 193. Input and output cells 192 are formed in the peripheral region. Corner cells 194 for power supply are assigned the corners of the peripheral area. Pads 195 are arranged over the inner/peripheral areas, and are electrically connected to the input and output cells 192 and the power supply units in the inner region 193.

In the prior art flip chip semiconductor device, three input and output cells 192 form an input and output cell group, and the input and output cell group are arranged at regular intervals equal to the intervals of the pads 195. For this reason, the three input and output cells 192 of each group are connected to the associated three pads 195 through a common wiring pattern. In order to repeatedly use the common wiring pattern, the input and output cell groups equal to a multiple of three are arranged along each edge of the prior art flip chip semiconductor device. Description is focused how a predetermined wiring pattern is repeatedly used for the input and output cell groups, and is silent to how the pads 195 are assigned the input and output cells 192 for the signal transmission and power supply.

A typical example of the pad assignment is that the pads are selectively assigned the input and output cells for the signal transmission and the power supply. As a result, the power supply pads tends to be mixed with the signal pads. The prior art flip chip semiconductor device is to be assembled with a package substrate. The package substrate has a multi-layered structure, and the multi-layered structure has a pad-forming layer where pads, which are to be connected to the pads of the prior art flip chip semiconductor device, are formed. The pads are electrically connected to wiring lines on other layers, and the wiring lines are finally connected to electrodes formed on the surface reverse to the pad-forming layer. Since the prior art flip chip semiconductor device has the power supply pads mixed with the signal pads, the package substrate also has the power supply pads mixed with the signal pads. When the manufacturer routes the wiring lines on the pad forming layer, some wiring layers are to bypass the power supply pads. The wiring layers change the layer through via-holes in order to bypass the power supply pads. For this reason, the number of layers for the prior art flip chip semiconductor device is increased. Even if the production cost for the prior art flip chip semiconductor device is constant, the total cost becomes high.

SUMMARY OF THE INVENTION

It is therefore an important object of the present invention to provide a flip chip semiconductor device, which is conducive to reduction of the total cost of an electric system.

In accordance with one aspect of the present invention, there is provided a flip chip semiconductor device of a multi-layered structure having a cell forming layer and a pad forming layer comprising input and output cells formed in the cell forming layer together with macro-cells, power supply pads formed in the pad forming layer and electrically connected to the input and output cells, and signal pads formed in the pad forming layer, electrically connected to the input and output cells and arranged outside of the power supply pads.

BRIEF DESCRIPTION OF THE DRAWINGS

The features and advantages of the flip chip semiconductor device will be more clearly understood from the following description taken in conjunction with the accompanying drawings in which:

FIG. 12 is a plane view showing power supply lines connected between power supply pads and the input and output cells of the flip chip semiconductor device shown in FIG. 9;

DESCRIPTION OF THE PREFERRED EMBODIMENTS

First Embodiment

Figures 3, 4:
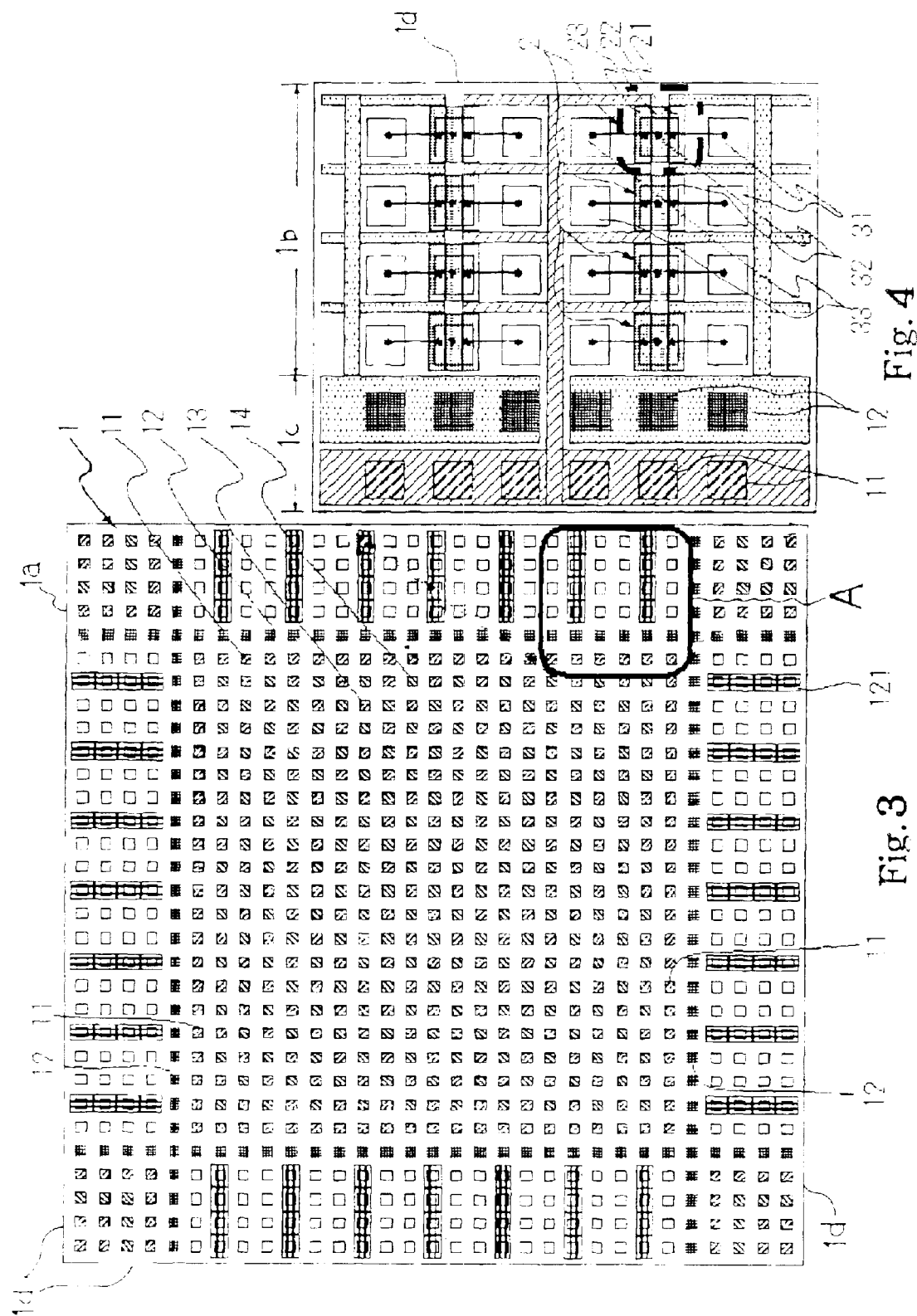
FIG. 3 is a plane view showing the layout of a flip chip semiconductor device according to the present invention.
FIG. 4 is a plane view showing a part of the layout at a large magnification ratio.

FIGS. 3 and 4 show the layout of a flip chip semiconductor device embodying the present invention. A part of the layout is encircled with real line A, and is enlarged in FIG. 4.

Reference numeral 1 designates the flip chip semiconductor device according to the present invention, and real line 1a is indicative of the periphery of the flip chip semiconductor device 1. In this instance, the flip chip semiconductor device 1 is fabricated on a rectangular chip. The rectangular chip is divided into a peripheral area 1b, an inner area and an intermediate area 1c between the inner area and the peripheral area 1b. The four edge lines of the rectangular chip are labeled with reference 1d.

Figure 20:
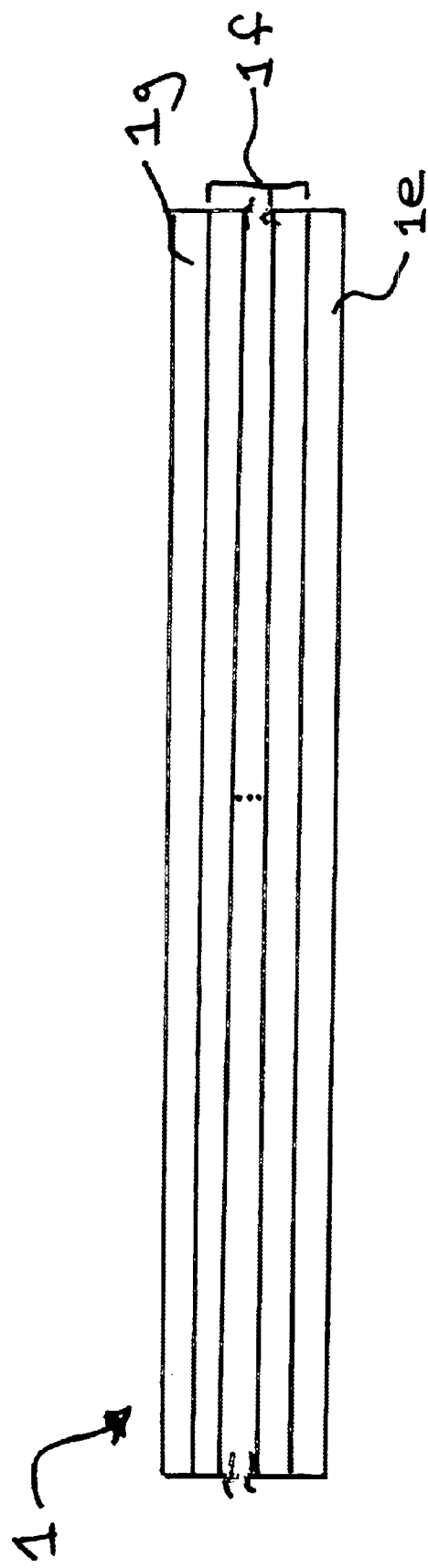
FIG. 20 is a cross-sectional view of the flip-chip semiconductor device of FIG. 3.

Most of the peripheral area 1b is assigned to input and output circuits such as those labeled with 21/22/23 and signal pads such as those labeled with 31/32/33. The input and output cells are herein below referred to as "input and output cells", and the signal pads are electrically connected to the input and output cells. Each of the input and output cells is implemented by an output driver circuit and/or input buffer circuit. An input and output controlling circuit may be further incorporated in the input and output cell. An input and output control circuit may be further incorporated in the input and output cell. Although the input and output cells are drawn on a level with the signal pads in FIGS. 3 and 4, the flip chip semiconductor device has a multi-layered structure, and the input and output cells are assigned a certain level lower than the level assigned to the signal pads. This assigned level may be referred to as a "cell forming layer." The signal pads are formed on the highest level of the multi-layered structure. The highest level is herein below referred to as "pad forming layer". FIG. 20 presents a cross-sectional view through the flip-chip semiconductor device 1 of FIG. 3, illustrating cell forming layer 1e, pad forming layer 1g, and intermediate layers 1f.

The input and output cells are arrayed in the peripheral area 1b, and plural input and output cells 31/32/33/forms an input and output cell group 2. One of the input and output cell groups 2 is encircled with broken line in FIG. 4. In this instance, three input and output cells are arranged in parallel to the associated edge line 1d, and form the input and output cell group 2. Plural input and output cell groups 2 are arranged in the perpendicular direction to the associated edge lines 1d, and form a column of input and output cell groups 2. In this instance, four input and output cell groups 2 form each of the columns of input and output cell groups 2. The input and output cell groups 2 in each column are spaced from one another, and the gap between the adjacent input and output cell groups 2 is assigned to wiring lines (not shown).

The signal pads are further arrayed in the peripheral area. Plural signal pads are arranged in the perpendicular direction to the associated edge line 1d, and form a column of signal pads. The number of the signal pads in each column is equal to the number of the input and output cell groups in each column. In this instance, four signal pads form each column of signal pads. Plural columns of signal pads 31/32/33 are associated with each column of input and output cells, and the number of columns of signal pads 31/32/33 is equal to the number of input and output cells of each input and output cell group 2. In this instance, three columns of signal pads 31/32/33 are associated with each column of input and output cell groups 2. One of the three columns of signal pads 32 is located over the column of input and output cell groups 2, and the other columns of signal pads 31 and 33 are formed on both sides of the column of signal pads 32. The signal pads 31 of the column are respectively connected to the input and output cells 21 of the associated column of input and output cell groups, the signal pads 32 of the column are respectively connected to the input and output cells 22 of the associated column of input and output cell groups, and the signal pads 33 of the column are respectively connected to the input and output cells 23 of the associated column of input and output cell groups. In this instance, the other columns of signal pads 31 and 33 are symmetry with respect to the column of signal pads 32. The columns of signal pads 31/32/33 are arranged at regular intervals, and, accordingly, the columns of input and output cell groups 2 are spaced at regular intervals. Each regular interval between the adjacent columns of input and output cell groups 2 is the multiple of the regular interval between the adjacent columns of signal pads 31/32/33.

The intermediate area 1c is assigned to power supply pads 11 and 12, and the power supply pads 11/12 are formed on the level with the signal pads 31/32/33, i.e., the pad forming layer. Thus, the power supply pads 11/12 are formed inside of the signal pads 31/32/33 and, accordingly, the input and output cells. The power supply pads 12 are arranged in parallel to the edge lines 1d, and, accordingly, form two columns in parallel to one of the two pairs of edge lines 1d. The other power supply pads 11 are arranged also in parallel to the edge lines 1d, and are located inside the power supply pads 12. A power voltage level VDD is supplied from the power supply pads 12 to the input and output cells such as those labeled with 21/22/23, and another power voltage level VSS is supplied from the other power supply pads 11 to the input and output cells. As will be described hereinlater in conjunction with another embodiment, the peripheral area is partially narrowed at the four corners of the rectangular chip so as to permit the power supply pads to occupy widely at the corners.

The power supply pads 11/12 are electrically connected to the input and output cells through power supply lines (not shown). In order to reduce the resistance of the power supply lines, wide power supply lines are used in the flip chip semiconductor device. However, wide occupation area is required for routing the wide power supply lines. Following counter measures may be selectively employed in the flip chip semiconductor device. The first counter measure is to space the input and output cells for routing the power supply lines therebetween. The second counter measure is widened the gap between the adjacent columns of input and output cell groups so as to route the power supply lines the wide space in parallel to the columns of input and output cell groups. Otherwise, the power supply lines are routed on a level with power supply lines connected to cells formed in the inner area.

Figure 21:
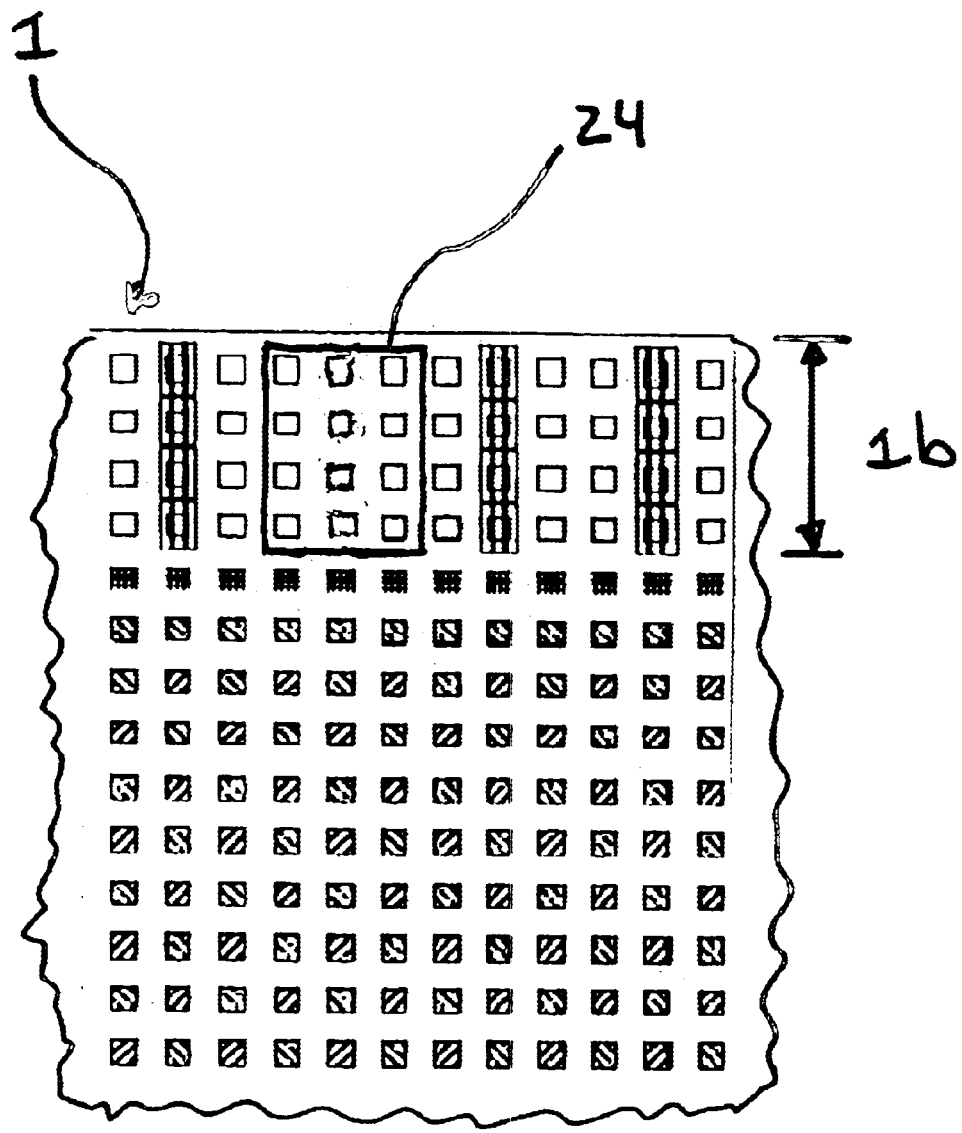
FIG. 21 is a plane view showing a portion of a layout of a flip-chip semiconductor device consistent with the principles of the device of FIG. 3.

The inner area of the pad forming layer is assigned to power supply pads 13/14. The power supply pads 13 are assigned to the power voltage VDD, and the power supply pads 14 are assigned to the other power voltage VSS. The power supply pads 13 are represented by small squares in FIG. 3, and each of the power supply pads 13 is hatched with oblique lines drawn from the upper corner of the left side to the lower corner of the right side. The power supply pads 14 are also represented by small squares. However, each of the power supply pads 14 is hatched with oblique lines drawn from the upper corner of the right side to the lower corner of the left side. Thus, the potential level on the power supply pads 13/14 is discriminated by comparing the direction of the hatching lines. As will be seen in FIG. 3, the power supply pads 13 are arranged in staggered fashion. On the other hand, the other power supply pads 14 occupy the vacant areas among the power supply pads 13, and are also laid on a staggered pattern. Macro-cells such as logic cells are fabricated under the inner area on the pad forming layer, and the power voltages VSS and VDD are supplied from the power supply pads 13/14 to the logic cells through via-holes. However, the input and output cells do not perfectly occupy the peripheral area 1b of the certain level. In other words, there are vacancies among the regions assigned to the input and output cells in the peripheral area 1b on the certain level. The manufacturer can assign other macro-cells to the vacancies (for example, as illustrated in FIG. 21 by macro-cell 24 positioned in a vacancy in peripheral area 1b of device 1). Thus, any real estate is not wasted.

As will be understood, the power supply pads 11/12/13/14 are formed inside the signal pads 31/32/33 located over the input and output cells 21/22/23. This feature is desirable, because any via holes is not formed in the peripheral area 1b. The input and output cells 21/22/23 are electrically connected to the signal pads 31/32/33 through the signal lines in the peripheral area 1b. The manufacturer routes the signal lines without taking the via-holes into account. Thus, the layout of the flip chip semiconductor device according to the present invention makes the design work on the signal lines easy.

Another advantage of the layout according to the present invention is improvement of device characteristics. The input and output cells 21/22/23 are powered with the power voltages VDD and VSS supplied from the power supply pads 11/12 through the power supply lines, and input/output signals are supplied from the signal pads 31/32/33 through the signal lines to the input and output cells 21/22/23. As described hereinbefore, the input and output cells 21/22/23 and the signal pads 31/32/33 are formed in the peripheral area 1b on the certain level and the peripheral area 1b on the highest level of the multi-layered structure, respectively. This results in that only short signal lines are required for the connection. Similarly, the power supply pads 11/12 are formed in the intermediate area 1c on the highest level of the multi-layered structure, and the intermediate area 1c is contiguous to the peripheral area 1b. This means that the power supply lines are not prolonged. A large amount of power voltage VDD/VSS is sufficiently supplied to the input and output cells 21/22/23 without serious fluctuation, and the input/output signals are not propagated between the signal pads 31/32/33 and the input and output cells 21/22/23 without serious impedance. For this reason, the input and output cells 21/22/23 are improved in dc characteristics and ac characteristics. Thus, the layout according to the present invention is conducive to the improvement in the device characteristics.

Figure 5:
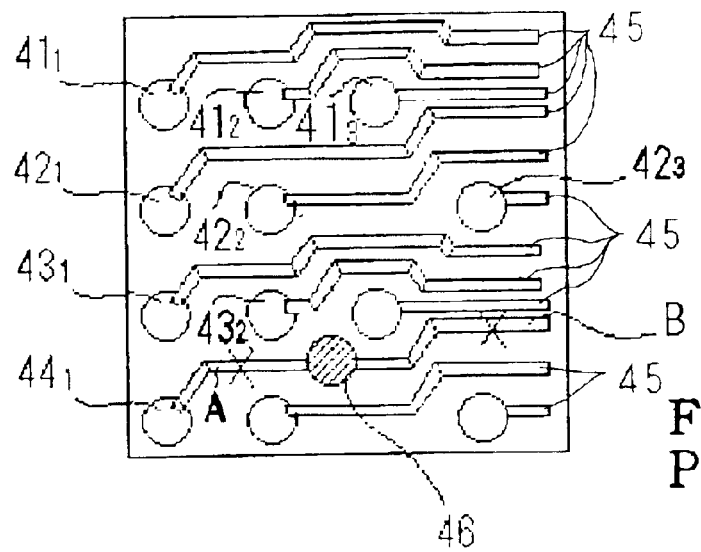
FIG. 5 is a plane view showing the layout of pads on a prior art package substrate.

The layout according to the present invention is desirable for a package substrate. The package substrate has one surface held in contact with the pads of the flip chip semiconductor device, and the input/output signals are transferred from the one surface to another surface through a multi-layered wiring layers. FIG. 5 shows a layout of pads on a prior art package substrate for a prior art flip chip semiconductor device. The prior art flip chip semiconductor device has both of the power supply and signal pads in the peripheral area of the chip. Accordingly, the prior art package substrate has a peripheral area where the signal pads such as those labeled with $41_1$–$41_3$, $42_1$–$42_3$, $43_1$, $43_2$ and $44_1$ are mixed with the power supply pad 46. Although the signal pads $41_1$–$41_3$, $42_1$–$42_3$, $43_1$ and $43_2$ are to be connected to the signal lines 45, the signal line A-B can not be connected to the pad $44_1$, because the power supply pad 46 is to be formed on the route of the signal line A-B. In order to bypass the power supply pad 46, the signal line A-B is routed to the signal pad $44_1$ on a different level of the multi-layered structure through a pair of via-holes. On the other hand, the flip chip semiconductor device according to the present invention has the power supply pads 11/12/13/14 in the intermediate area and the inner area on the pad forming layer. Accordingly, a package substrate has the power supply pads inside of the signal pads. In other words, there is not any power supply pad corresponding to the power supply pad 46 in the peripheral area of the package substrate. This means that any obstacle is never found in the peripheral area. For this reason, the manufacturer can connect the signal lines without any additional level for the bypassing.

This advantage is confirmed in the flip chip semiconductor device shown in FIGS. 3 and 4. The flip chip semiconductor device has the signal pads 31/32/33 concentrated in the peripheral area 1b on the pad forming layer, and the power supply pads 11/12/13/14 are formed inside the signal pads 31/32/33. The package substrate for the flip chip semiconductor device has the signal pads concentrated in the peripheral area, and the signal lines are to be connected without any bypassing line on a different level. This results in reduction of wiring levels. In other words, the package substrate for the flip chip semiconductor device is simpler than that for the prior art flip chip semiconductor device, and the total cost for the system is drastically reduced.

Figure 6:
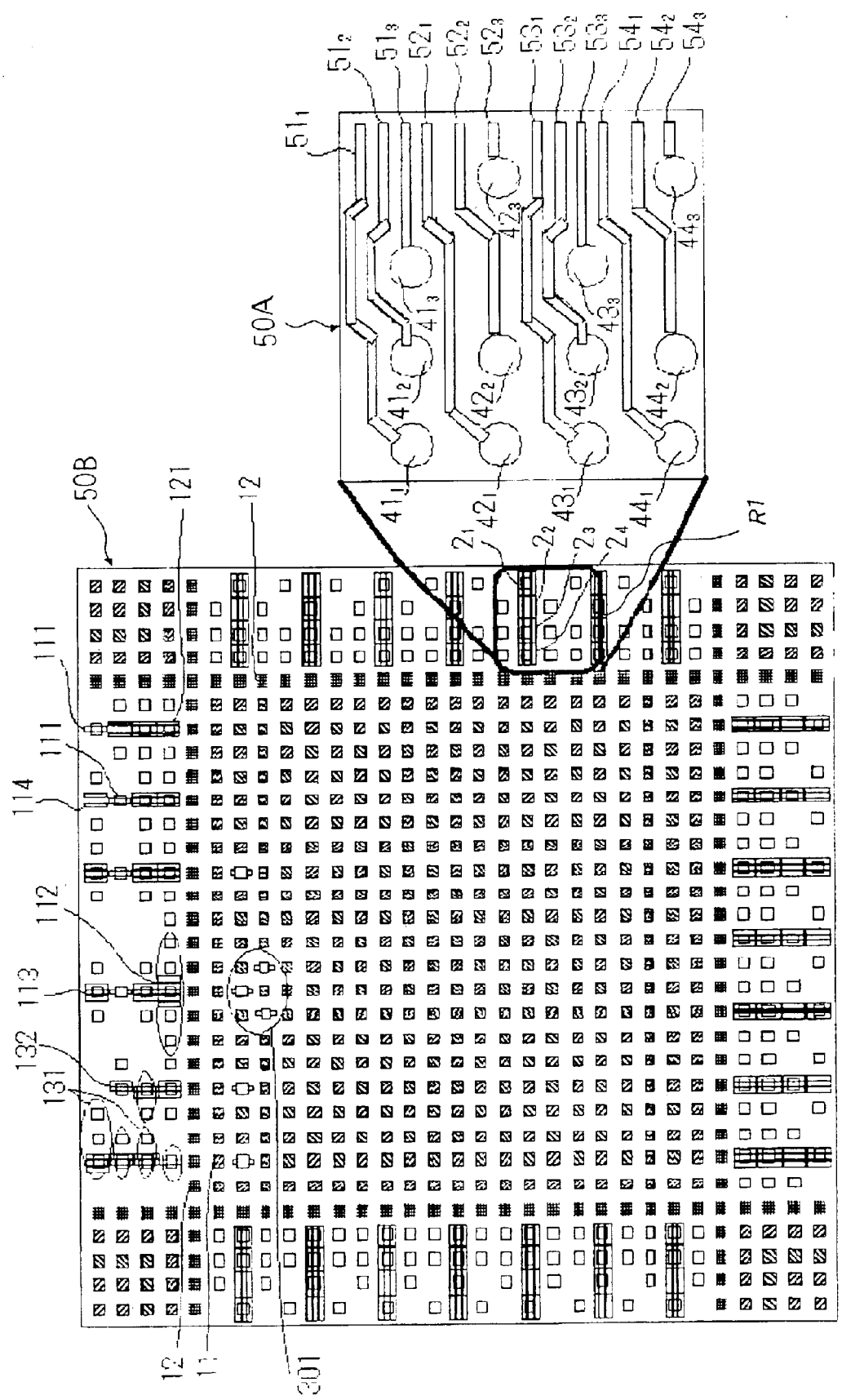
FIG. 6 is a plane view showing a part of a package substrate to be assembled with a flip chip semiconductor device according to the present invention and several modifications.

Even if signal pad are arranged more complicated than the signal pads 31–33, the flip chip semiconductor device keeps the package substrate simple. FIG. 6 shows a part of a package substrate 50A to be assembled with a flip chip semiconductor device 50B formed with signal pads more complicated. The part of the package substrate 50A is to be connected to a part of the flip chip semiconductor device 50B encircled with real line R1. The flip chip semiconductor device 50B has columns of input and output cell groups in the peripheral area, and one of the columns of input and output cell groups is within the real line R1. The column of input and output cell group includes four input and output cell groups $2_1$, $2_2$, $2_3$ and $2_4$. The input and output cell group $2_1$ has only one input and output cells, and the associated signal pad is located over the input and output cell group $2_1$. The input and output cell group $2_2$ has two input and output cells, and two signal pads are located on both sides of the input and output cell group $2_2$. The input and output cell group $2_3$ has three input and output cells, and the associated signal pads are located over the input and output cell group $2_3$ and both sides thereof. The input and output cell group $2_4$ also has three input and output cells, and the associated signal pads are arranged in the similar manner to those associated with the input and output cell group $2_3$. The signal pad groups $41_1$ to $41_3$, $42_1$ to $42_3$ and $43_1$ to $43_3$ are corresponding to the column of input and output cell groups $2_1$, $2_2$, $2_3$ and $2_4$. The signal pad for the input and output cell group $2_1$ is to be connected to the signal pad $42_3$, and the signal pad $42_3$ is located on the rightmost side of the part of the package substrate 50A. The signal pads for the input and output cell group $2_2$ are to be connected to the signal pad $41_3$ and $43_3$, and the signal pads $41_3$ and $43_3$ are located in the elongated area next to the elongated area assigned to the signal pad $42_3$. The signal pads for the input and output cell group $2_3$ are to be connected to the signal pad $41_2$, $42_2$ and $43_2$, and the signal pads $41_2$, $42_2$ and $42_3$ are located in the elongated area next to the elongated area assigned to the signal pads $41_3$ and $43_3$. Similarly, the signal pads for the input and output cell group $2_3$ are to be connected to the signal pad $41_1$, $42_1$ and $43_1$, and the signal pads $41_1$, $42_1$ and $43_1$ are located in the elongated area on the leftmost side of the part of the package substrate 50A. Signal lines $51_1$, $51_2$ and $51_3$, $52_1$, $52_2$ and $52_3$ and $53_1$, $53_2$ and $53_3$ are routed on the level with the signal pads $41_1$, $41_2$ and $41_3$, $42_1$, $42_2$ and $42_3$ and $43_1$, $43_2$ and $43_3$, and are connected to the signal pads $41_1$, $41_2$ and $41_3$, $42_1$, $42_2$ and $42_3$ and $43_1$, $43_2$ and $43_3$, respectively. Thus, neither via-hole nor bypassing line on a different level is required for the signal pads $41_1$, $41_2$ and $41_3$, $42_1$, $42_2$ and $42_3$ and $43_1$, $43_2$ and $43_3$, and the flip chip semiconductor device 50B makes the package substrate 50A simple. The signal lines $51_1$, $51_2$ and $51_3$, $52_1$, $52_2$ and $52_3$ and $53_1$, $53_2$ and $53_3$ are connected through via-holes to electrodes formed on the reverse surface. Although the prior art package substrate requires 6-layers for the connection between the signal pads to the electrodes, the package substrate 50A only requires 4 layers, and the multi-layered structure of the package substrate 50A is less than the multi-layered structure of the prior art package substrate by two.

Figure 7:
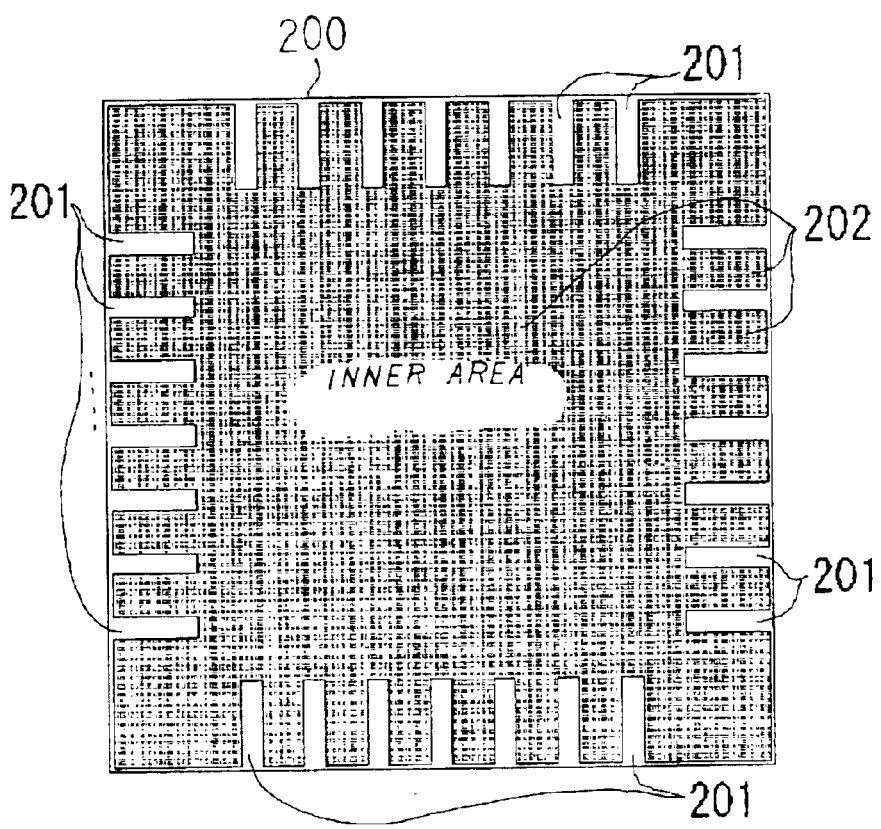
FIG. 7 is a plane view showing the layout of the flip chip semiconductor device according to the present invention.
Figure 8:
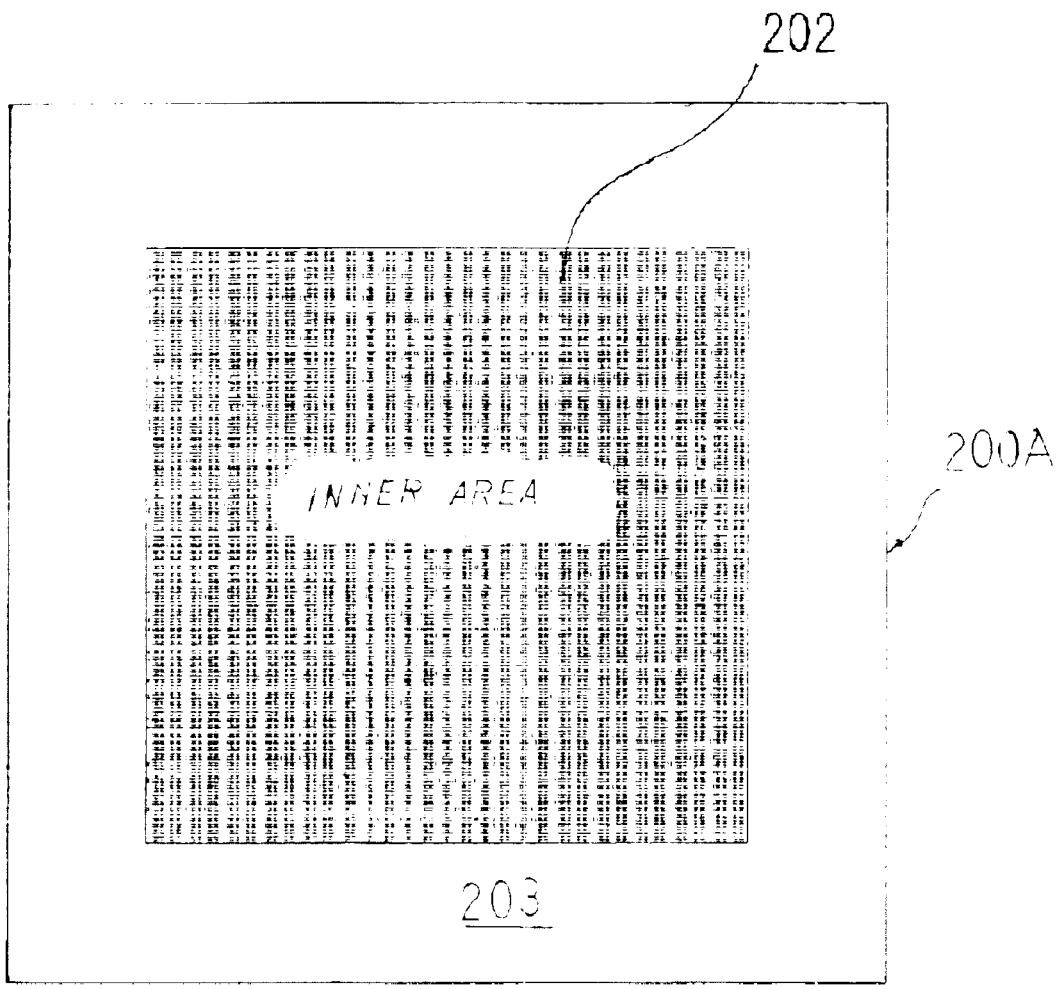
FIG. 8 is a plane view showing the layout of another flip chip semiconductor device according to the present invention.

Although the input and output cells 21/22/23 are assigned the peripheral area on the certain level of the multi-layered structure, the input and output cells 21/22/23 may occupy part of the peripheral area. In this instance, the logic cells may be fabricated on the remaining part of the peripheral area. FIG. 7 shows a flip chip semiconductor device of the type having columns of input and output cell groups in parts of the peripheral area. The flip chip semiconductor device is fabricated on a rectangular semiconductor chip 200. The columns of input and output cell groups are assigned regions 201 occupying the peripheral area at intervals. As a result, an inner area 202 projects into the gaps among the regions 201, and a large amount of macro-cells (not shown) are formed in the inner area 202. FIG. 8 shows yet another flip chip semiconductor device 200A. The macro-cells are formed in the inner area 202 perfectly encircled with the peripheral area 203. Although the input and output cells do not perfectly occupy the peripheral area, any macro-cell is not formed in the peripheral area. The flip chip semiconductor devices 200 and 200A are assumed to require 961 pads. The pads are arranged in the pad forming layer of the flip chip semiconductor device 200 as similar to those on the pad forming area of the flip chip semiconductor device. However, the flip chip semiconductor device 200A requires a rectangular chip twice as large as the rectangular chip of the flip chip semiconductor device 1/200 for 961 pads, because the gaps between the input and output cells are vacant. Thus, the arrangement of pads shown in FIG. 7 is conducive to the reduction of chip size, and, accordingly, permits the manufacturer to reduce the production cost. As a consequence, the flip chip semiconductor chip according to the present invention achieves the reduction of cost as well as the improvement of the device characteristics.

Second Embodiment

Figure 9:
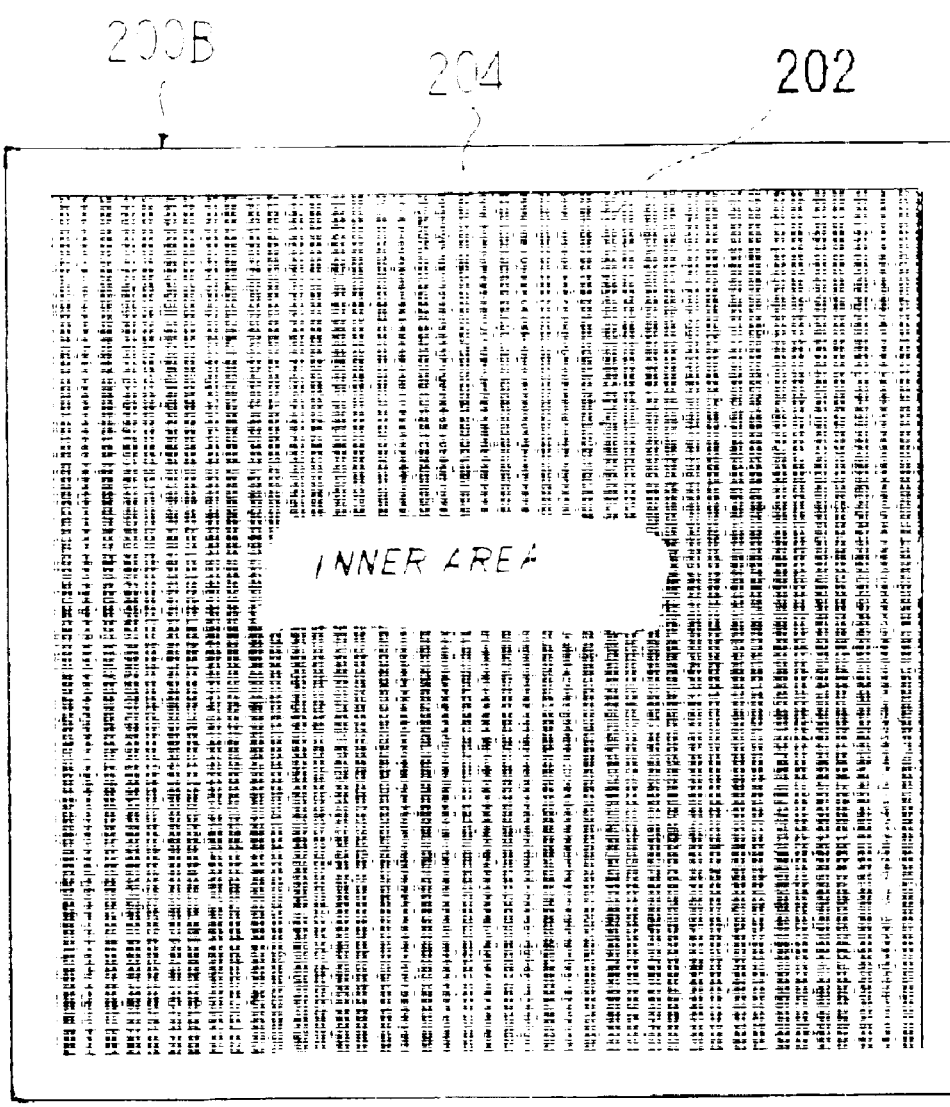
FIG. 9 is a plane view showing the layout of yet another flip chip semiconductor device according to the present invention.
Figure 10:
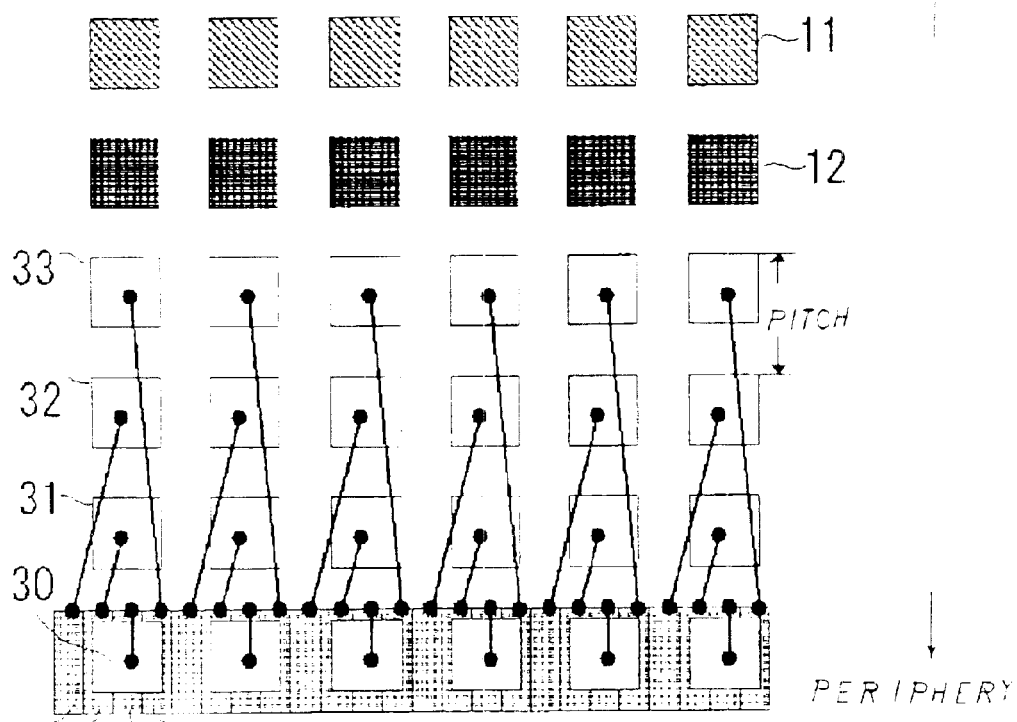
FIG. 10 is a plane view showing signal lines connected between signal pads and input and output cells incorporated in the flip chip semiconductor device shown in FIG. 9.
Figure 1:
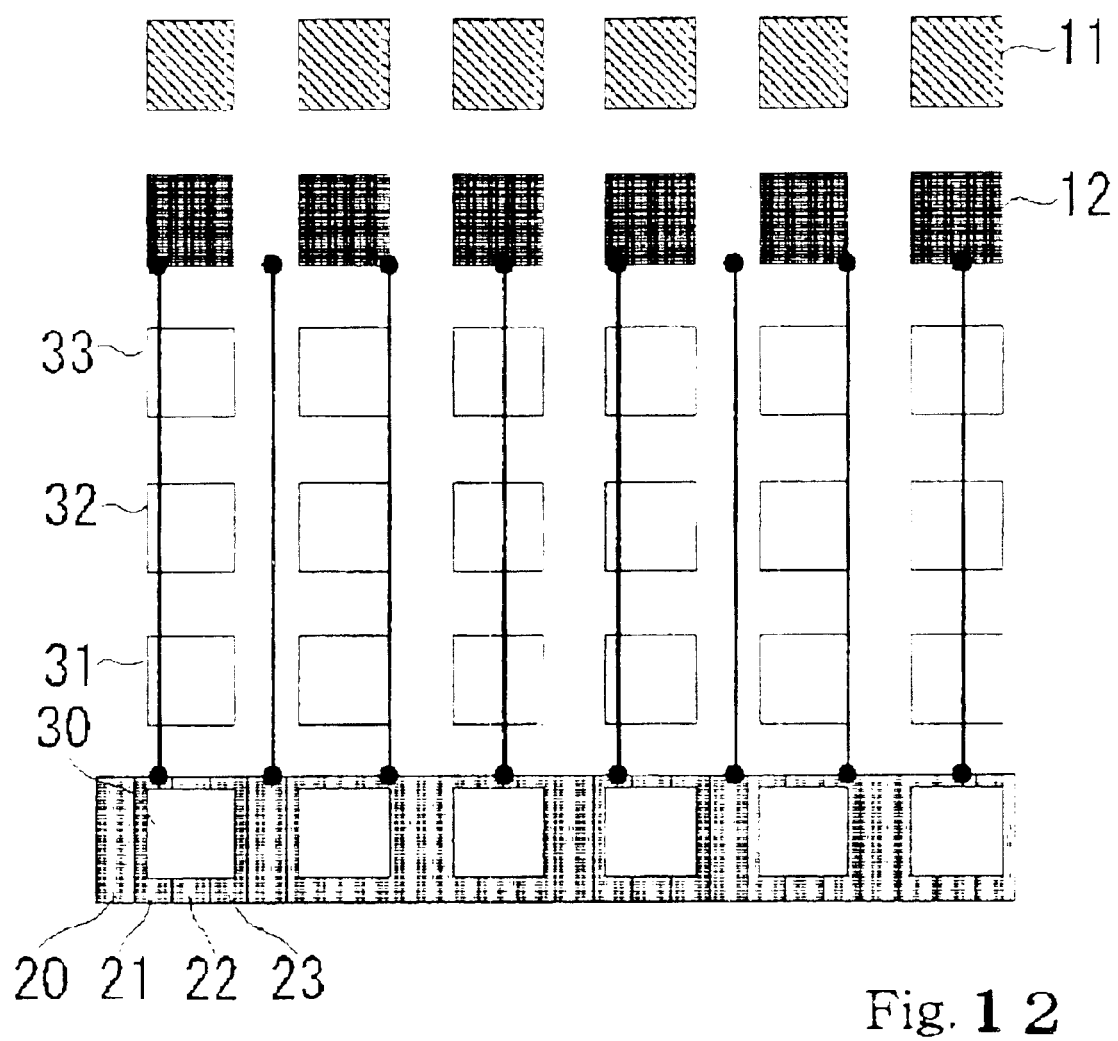

FIG. 9 shows yet another flip chip semiconductor device 200B implementing the present invention. The flip chip semiconductor device 200B has a multi-layered structure, and the multi-layered structure includes a certain level assigned to cells and the highest level assigned to pads. Since FIG. 9 illustrates the layout of pads and cells, the pads are on a level with the cells. The layout includes an inner area 202 and a peripheral area 204. Macro-cells (not shown) are formed in the inner area 202 on the certain level, and input and output cells such as those labeled with 20, 21, 22 and 23 are formed in the peripheral area 204 on the certain level (see FIG. 10). The input and output cells 20/21/22/23 are located in the outermost region of the peripheral area 204, and any macro-cell is never formed outside of the input and output cells 20/21/22/23.

The signal pads 30, 31, 32 and 33 are arrayed on the highest level, i.e., the pad forming layer, and the array of signal pads 30, 31, 32 and 33 occupy the peripheral area 204 and the inner area 202. Power supply pads 11/12 are formed inside the signal pads 30, 31, 32 and 33, and the input and output cells 20, 21, 22, and 23 are powered through predetermined power supply pads 11/12. Any power supply pad is not formed in the peripheral area 204 on the highest level, nor mixed with the signal pads 30, 31, 32 and 33. Thus, the flip chip semiconductor device 200B is only different form the flip chip semiconductor device 1 shown in FIGS. 3 and 4 in that the input and output cells 20/21/22/23 are arranged in a line.

When the manufacturer designs a package substrate to be assembled with the flip chip semiconductor device 200B, only the signal pads are formed in the peripheral area, and any power supply pad is not mixed with the signal pads. For this reason, any one of the power supply pads is not an obstacle against the routing work. The signal lines are directly connected to the signal pads, and any additional wiring layer is not required for the electrical connection. As a result, the production cost of the package substrate is reduced. Thus, the flip chip semiconductor device implementing the second embodiment permits the manufacturer to reduce the total production cost of the electric system.

Subsequently, description is made on signal lines between the input and output cells 20/21/22/23 and the signal pads 30/31/32/33 and power supply lines between the input and output pads 20/21/22/23 and power supply pads 11/12 in comparison with those of the flip chip semiconductor device 1 implementing the first embodiment.

Figure 11:
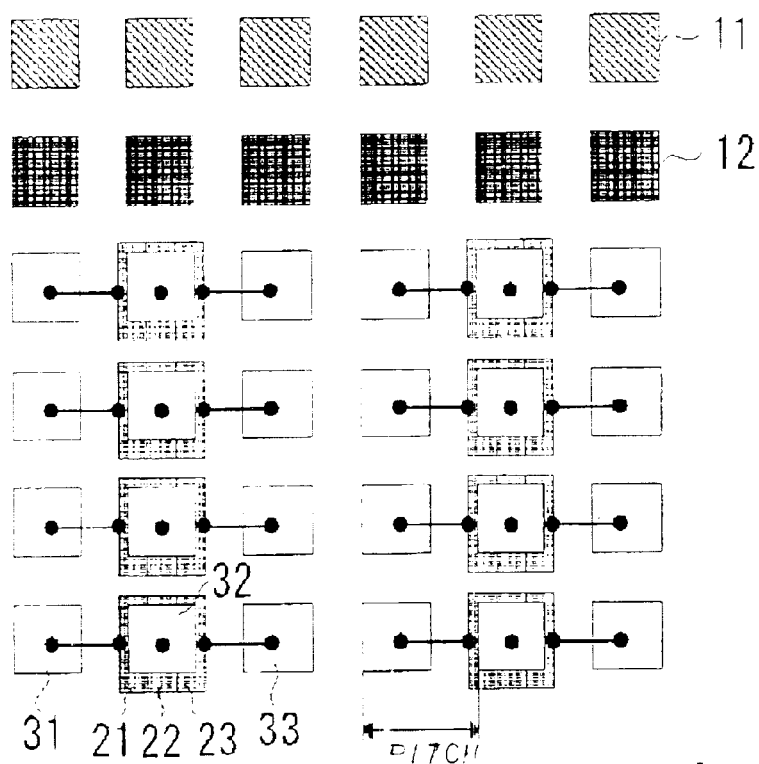
FIG. 11 is a plane view showing the signal lines connected between the signal pads and the input and output cells of the flip chip semiconductor device shown in FIGS. 3 and 4.

The flip chip semiconductor device 1 implementing the first embodiment has the positional relation among the input and output cells 21/22/23, signal pads 31/32/33 and the power supply pads 11/12 as shown in FIG. 11. The input and output cell 21 and the other input and output cells 22/23 are connected directly through the via-holes to the signal pad 32 and through the via-holes and signal lines to the signal pads 31/33 in the flip chip semiconductor device 1 implementing the first embodiment. The length of the signal lines is zero and as long as one regular pitch. On the other hand, the input and output cells 20/21/22/23 are connected through the via-hole and signal lines to the signal pads 31/32/33 in the flip chip semiconductor device implementing the second embodiment. The minimum signal length is 0.5 regular pitch, and the maximum signal length is equal to 2.5 regular pitches.

Figure 13:
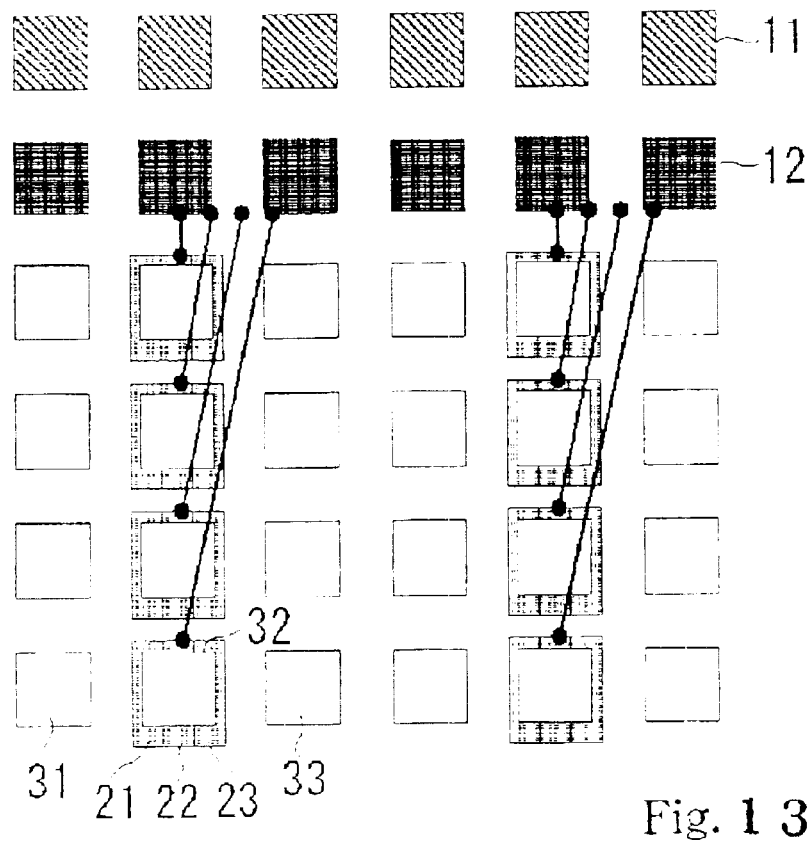
FIG. 13 is a plane view showing the power supply lines connected between the power supply pads and the input and output cells of the flip chip semiconductor device shown in FIGS. 3 and 4.

As to the power supply lines, the input and output cells 21/22/23 are connected through the via-holes and power supply lines to the power supply pads 12 in the flip chip semiconductor device 1 implementing the second embodiment as shown in FIG. 12. The length of the power supply lines is as long as 3.5 regular pitches. On the other hand, the input and output cells 20/21/22/23 are connected through the via-hole and power supply lines to the power supply pads 12 in the flip chip semiconductor device implementing the first embodiment as shown in FIG. 13. The minimum signal length is 0.5 regular pitch to 3.5 regular pitches.

The macro-cells are formed in the vacancies in the peripheral area of the flip chip semiconductor device 1 implementing the first embodiment, and the rectangular chip to be required is smaller than that to be required for the flip chip semiconductor device implementing the second embodiment.

In summary, the flip chip semiconductor device implementing the first embodiment has the short signal lines and power supply lines varied in length. On the other hand, the flip chip semiconductor device implementing the second embodiment has the power supply lines constant in length and signal lines varied in length. The input and output cells 21/22/23 of the flip chip semiconductor device implementing the first embodiment are expected to drive loads fallen within a relatively narrow range, and the output characteristics are constant. The power distribution to the input and output cells is constant and stable in the flip chip semiconductor device implementing the second embodiment. However, the output characteristics are less constant rather than those of the flip chip semiconductor device implementing the first embodiment. Thus, the manufacturer selectively employs the layouts depending upon the device characteristics to be required.

Third Embodiment

Figure 14:
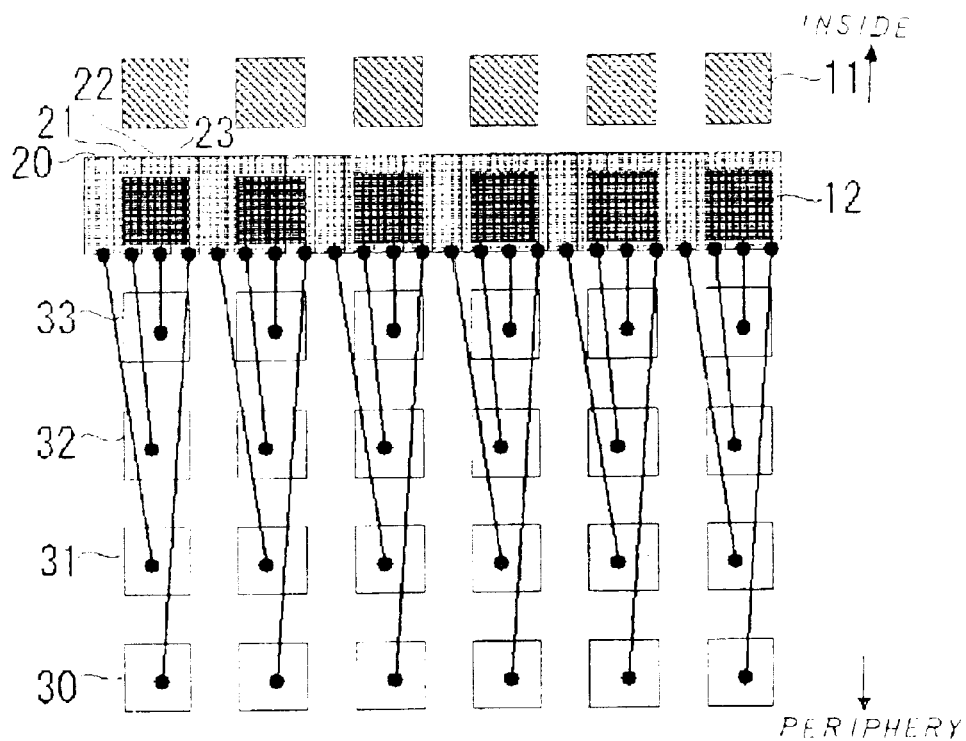
FIG. 14 is a plane view showing the layout of pads and input and output cells incorporated in still another flip chip semiconductor device according to the present invention.
Figure 15:
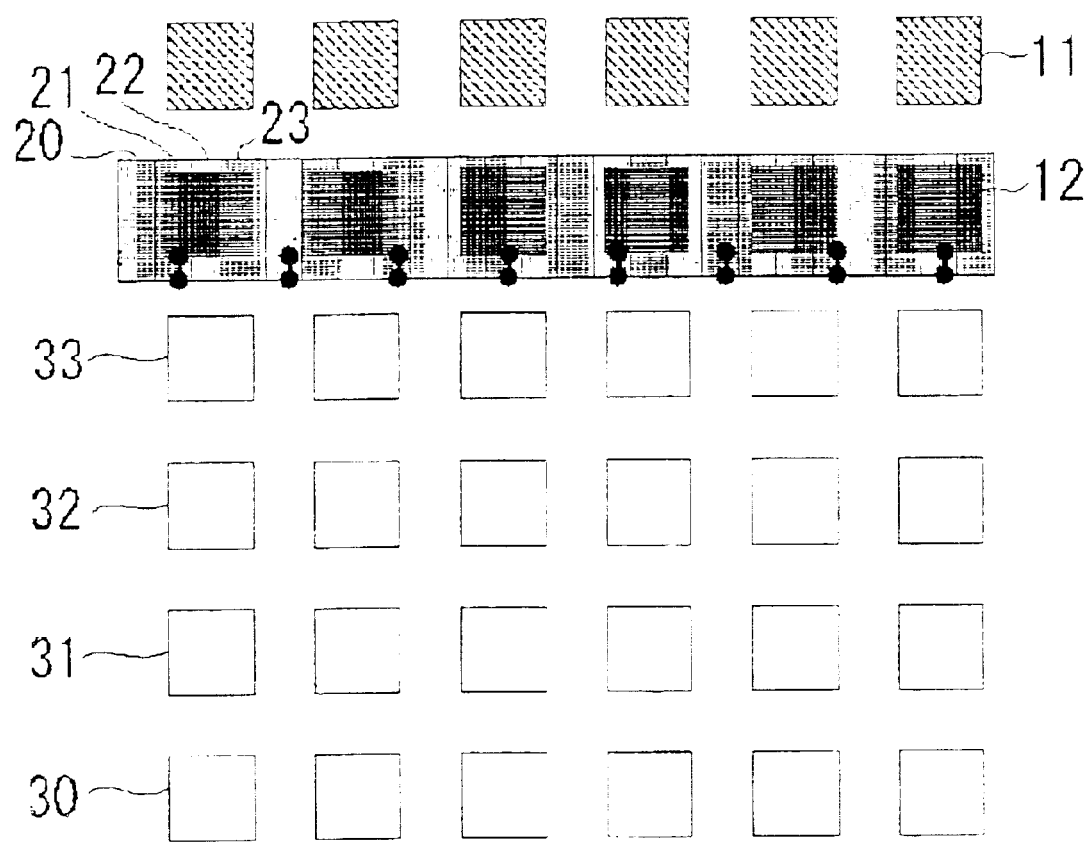
FIG. 15 is a plane view showing power supply lines incorporated in the flip chip semiconductor device.

FIGS. 14 and 15 show layout of pads, i.e., power supply pads and signal pads together with input and output cells incorporated in still another flip chip semiconductor device embodying the present invention. The flip chip semiconductor device has a multi-layered structure, and the input and output cells 20/21/22/23 are formed in a certain layer of the multi-layered structure together with macro cells (not shown). The macro-cells are located inside of the input and output cells 20/21/22/23 (see FIG. 8). The multi-layered structure further has a pad forming layer on which the signal pads 30/31/32/33 and power supply pads 11/12 are formed. The pads 11/12/30/31/32/33 are arranged at regular pitches. The power supply pads 11/12 are located inside of the input and output cells 30/31/32/33. Although the power supply pads 12 are over the input and output cells 20/21/22/23, any power supply pad is not mixed with the signal pads 30/31/32/33.

The flip chip semiconductor device is to be assembled with a package substrate (not shown). When the manufacturer designs the package substrate to be assembled with the flip chip semiconductor device, the signal pads 30/31/32/33 are formed outside the power supply pads 11/12, and any power supply pad is not mixed with the signal pads 30/31/32/33. For this reason, any one of the power supply pad 11/12 is not an obstacle against the routing work. The signal lines are directly connected to the signal pads, and any additional layer is not required for the electrical connection. As a result, the production cost of the package substrate is reduced. Thus, the flip chip semiconductor device implementing the third embodiment permits the manufacturer to reduce the total production cost of the electric system.

The input and output cells 20/21/22/23 are connected through via-holes and signal lines to the signal pads 30/31/32/33 as shown in FIG. 14. The length of the signal lines is varied from 0.5 regular pitch to 3.5 regular pitches. On the other hand, the power supply pads 12 are connected through the via-holes to the input and output cells 20/21/22/23, and the power supply pads 11 are connected through via-holes and signal lines to the input and output cells 20/21/22/23. The length of the power supply lines is zero or equal to 0.5 regular pitch.

The length of the signal lines is widely varied, and a large chip is required for the flip chip semiconductor device due to the array of signal pads. However, the power supply lines are the shortest of all and constant in length. Thus, the flip chip semiconductor device implementing the third embodiment widens the repertoire of the manufacturer.

Table 1 describes the features of the flip chip semiconductor devices implementing the first, second and third embodiments.

TABLE 1

|  | 1st Embodiment | 2nd embodiment | 3rd embodiment |
| --- | --- | --- | --- |
| Production Cost of Package Substrate | Reduced | Reduced | Reduced |
| Signal Lines | Best (FIG. 11) 0–1 regular pitch | Ordinary (FIG. 10) 0.5–2.5 regular pitches | Ordinary (FIG. 14) 0.5–3.5 regular pitches |
| Power Supply Lines | Better (FIG. 13) 0.5–3.5 regular pitches | Ordinary (FIG. 12) 3.5 regular pitches | Best (FIG. 15) 0.5 regular pitch |
| Area Assigned to Macro-cell | Best (FIG. 7) | Best (FIG. 9) Area not Occupied by I/O cells | Ordinary (FIG. 8) Inside of I/O cells |

There are various modifications of the flip chip semiconductor device according to the present invention. These modifications are hereinbelow described with reference to FIGS. 3, 4, 6 and 16–19.

Layout of Input and Output Cells

Although the plural input and output cells 21/22/23 are arranged in parallel to the associated edge lines 1d (see FIGS. 3 and 4) for forming one of the input and output cell groups, an input and output cell group contains only one input and output cell 111 in the first modification (see FIG. 6). The input and output cell 111 is preferable for driving a high speed signal such as, for example, a serial bit train, because the high speed signal is free from cross-taking with the signals driven by the adjacent input and output cells.

The input and output cell group contains an even number of input and output cells such as, for example, four input and output cells 112 (see FIG. 6) in the second modification.

When every input and output cell group has a predetermined number of input and output cells, the layout is simple, and the design work is easy. The flip chip semiconductor device implementing the first embodiment has the plural input and output cell groups each having three input and output cells. However, the third modification includes plural input and output cell groups different in the number of input and output cells. In this instance, the input and output cell groups may have only one input and output cell 111, two input and output cells 114, three input and output cells 113 and four input and output cells 112 (see FIG. 6).

Figure 16:
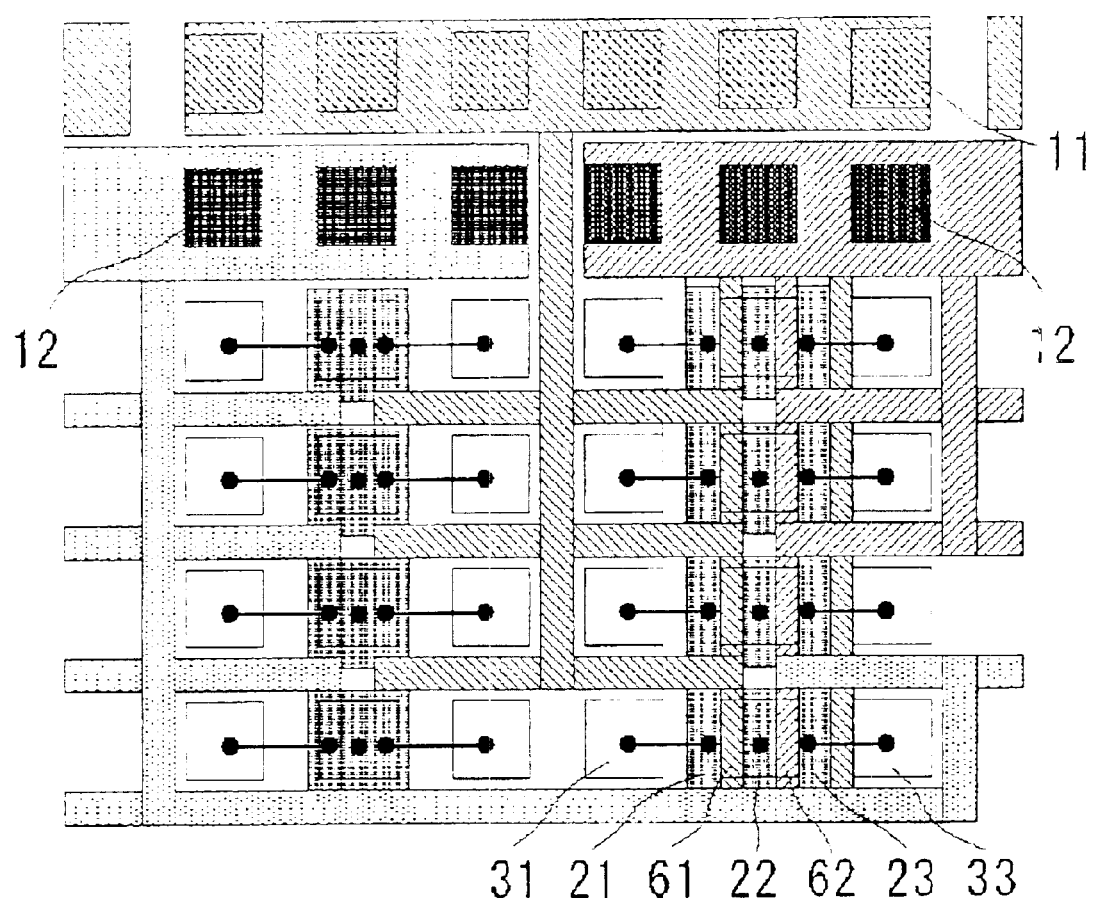
FIG. 16 is a plane view showing the layout of input and output cell groups incorporated in a modification of the flip chip semiconductor device according to the present invention.

The input and output cells in each cell group are contiguous to one another in the flip chip semiconductor device implementing the first embodiment. In the fourth modification, input and output cells 21/22/23 in a cell group are spaced from one another in a column as shown in FIG. 16. The spaces 61/62 between the input and output cells 21/22/23 are assigned to power supply lines.

Input and output cells are asymmetrically arranged in cell groups of the fifth modification. The input and output cell group 131 has the input and output cell or cells on the right side of the center input and output cell, and the input and output cell group 132 has the input and output cell on the left side of the central input and output cell. The input and output cells on the right side may be different in number from the input and output cells on the left side.

Layout of Input and Output Cell Groups

Figure 17:
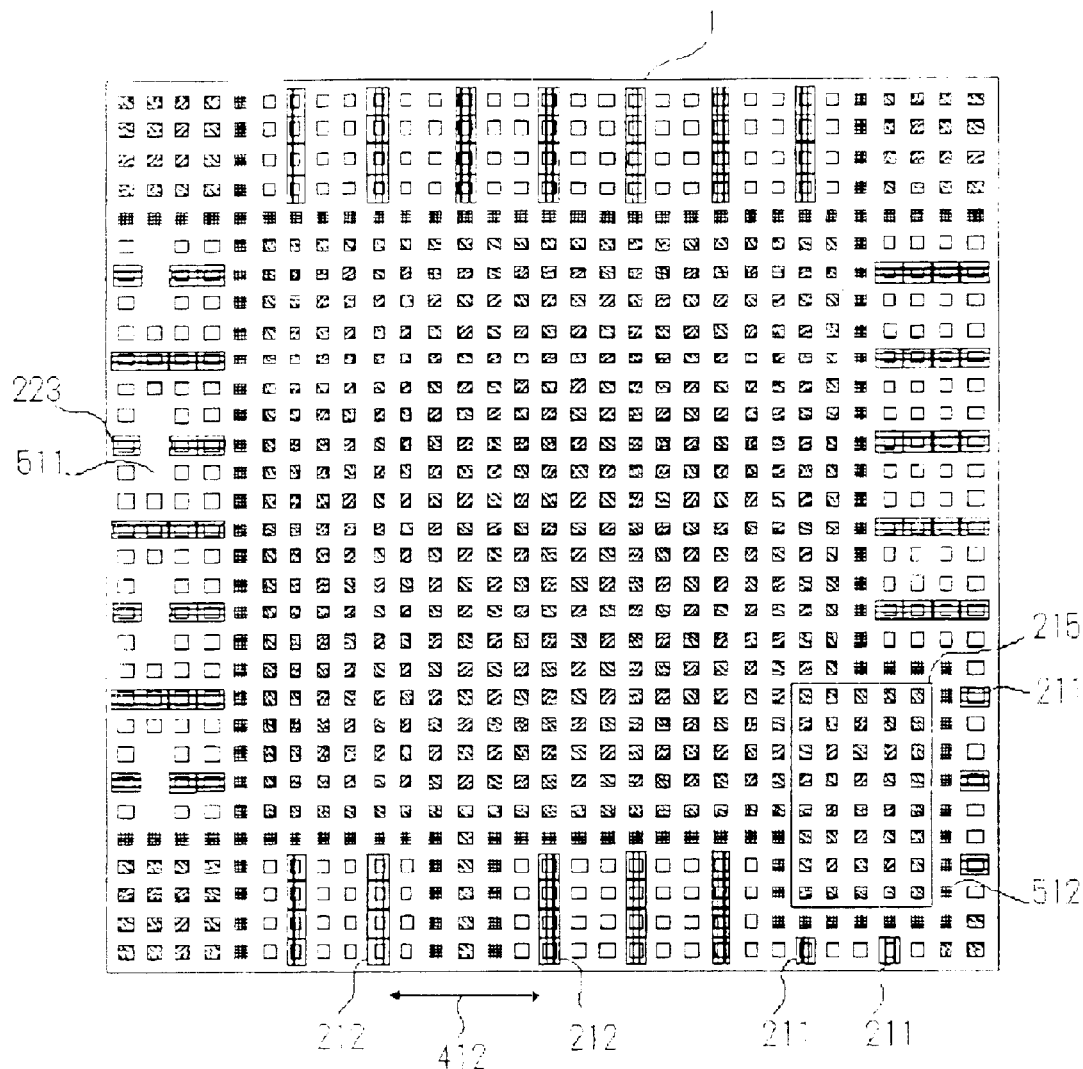
FIG. 17 is a plane view showing the layout of pads and input and output cells for several modifications.
Figure 18:
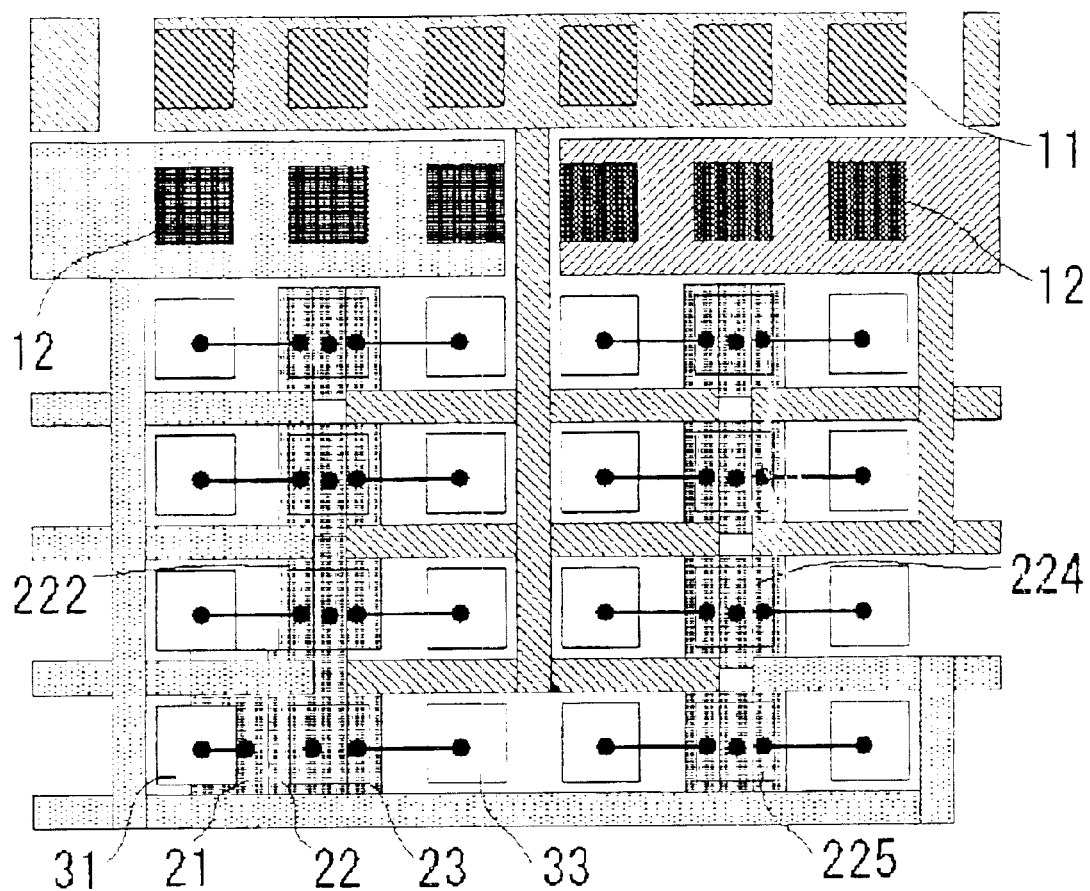
FIG. 18 is a plane view showing the layout of pads and input and output cells for several modifications.

The sixth modification has an isolated input and output cell group 211 as well as columns of input and output cell groups 212 (see FIG. 17). The isolated input and output cell group 211 serves as a column of input and output cell groups. A column of input and output cell group 223 is different in the number of input and output cell groups from the columns of input and output cell groups 212 and the columns of input and output groups 211. The column of input and output cell group has only one input and output cell group, the column of input and output cell groups 223 includes three input and output cell groups, and the four input and output cell groups form the columns of input and output cell groups 212.

The seventh modification has a large macro-cell block 215. The large macro-cell block penetrates into the peripheral area of the certain layer of the multi-layered structure. However, any input and output cell is never located inside the large macro-cell block. In other words, all the input and output cells are outside of the macro-cells.

Intervals of Input and Output Cell Groups

The input and output cell groups are arranged in the column without any space in the flip chip semiconductor device implementing the first embodiment. This feature is preferable, because the input and output cells are arranged at high dense. However, an input and output cell group 224 of a column is spaced from the adjacent input and output cell group 225 in the same column in the eighth modification. Of course, it is not necessary to introduce a space in every column. The eighth modification has an input and output cell 22 contiguous to an input and output cell group 222 in the same column. The input and output cell groups of the column 223 are also spaced from one another, and the space is equivalent to the area to be occupied by an input and output cell group. The space between the input and output cell groups 224 and 225 is assigned signal/power supply lines. Several input and output cell groups 301 may be formed in the inner area of the certain layer (see FIG. 6). However, all the signal pads are outside of the power supply pads for the input and output cells. The input and output cells may be concentrated in a part of the peripheral area along one of the edge lines.

In the flip chip semiconductor device implementing the first embodiment, the columns of input and output cells are arranged at regular intervals each equal to a multiple of the interval between the columns of signal pads. The ninth modification has a vacancy 412 between columns of input and output cell groups arranged at regular intervals (see FIG. 17). The vacancy may be formed at the boundary between a power supply pad group assigned to a certain voltage such as 3.3 volts and an adjacent power supply pad group assigned to another voltage such as 2.5 volts. The vacancy 412 is available for the power supply lines. The power supply lines supplies the power voltages to the columns input and output cell groups 212 in the lateral direction, and are reduced in length.

Figure 19:
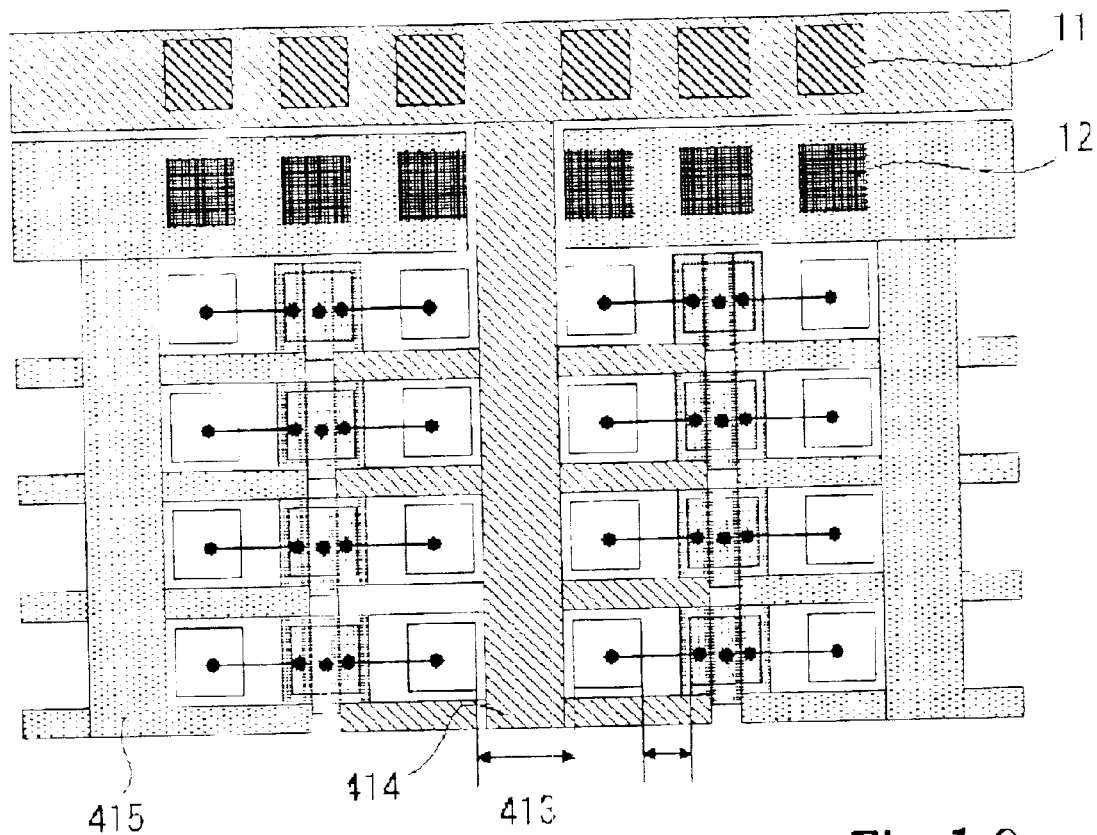
FIG. 19 is a plane view showing the layout of pads and input and output cells for several modifications.
Figure 1:
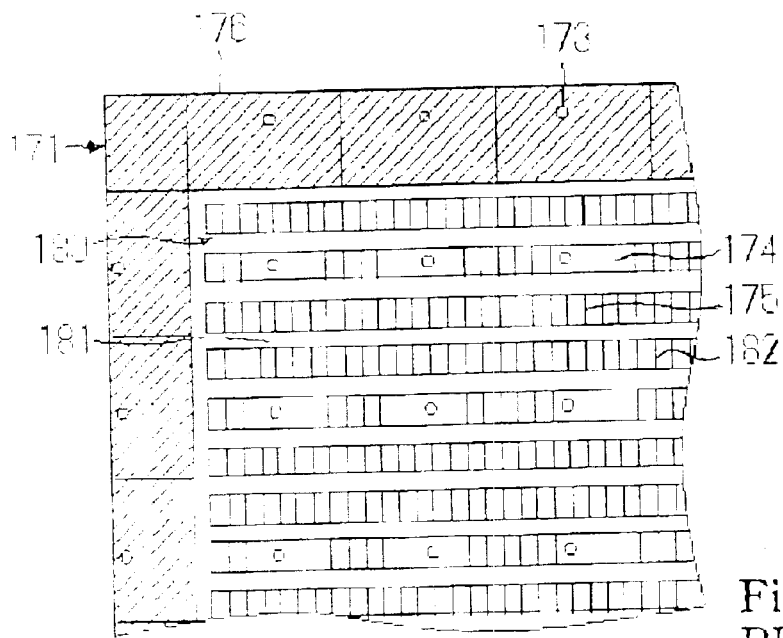
FIG. 1 is a plane view showing the layout of the prior art flip chip semiconductor device disclosed in Japanese Patent Application laid-open No. 5-267302.
Figure 2:
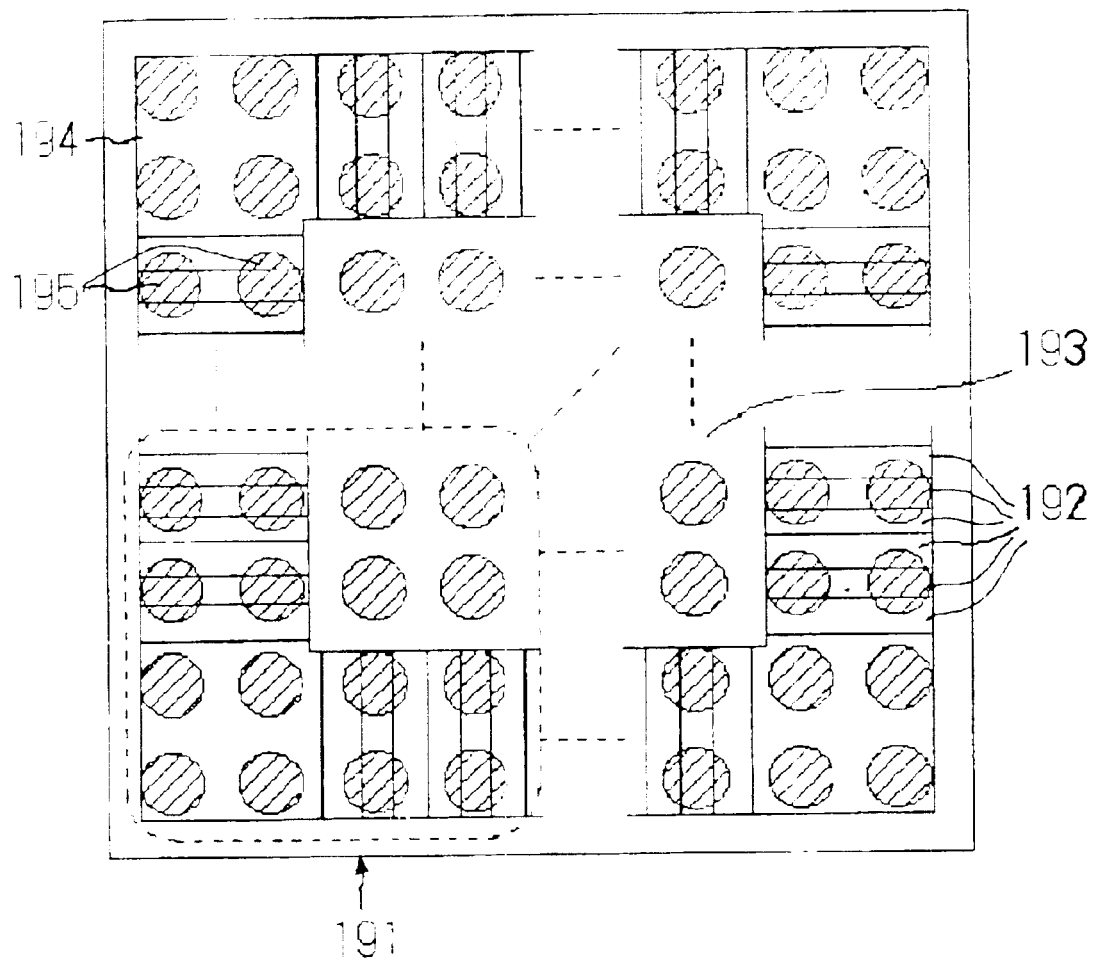
FIG. 2 is a plane view showing the layout of the prior art flip chip semiconductor device disclosed in Japanese Patent Application laid-open No. 2000-389519.

In the tenth modification, the columns of input and output cell groups are widened so as to permit the manufacturer to pass the power supply lines 414 (see FIG. 19). The space between the columns of signal pads is wider than the power supply line 414.

Layout of Signal Pads

The signal pads are corresponding to the input and output cells. If an input and output cell group is removed from a column of input and output cell groups as indicated by reference numeral 511 (see FIG. 17), signal pads to be associated with the input and output cell group are also removed.

In the seventh modification, the large macro-cell penetrates into the peripheral area so that the inner area has a polygonal shape. Thus, the inner area and the peripheral area are not restricted to a rectangular shape and frame-like shape. The input and output cells occupy areas narrower than the areas occupied by the signal pads. However, the input and output cell 22 of the eighth modification occupies the area wider than the area occupied by the associated signal pad (see FIG. 18). Thus, appropriate macro-cells are selected for the input and output cells.

The fourth modification has the spaces 61/62 among the input and output cells so that the power supply lines are routed through the spaces 61/62. Otherwise, the columns of input and output cell groups are widely spaced in the tenth modification, and the power supply lines 414/415 are routed through the space 413. These power supply lines are so wide that the signal paths between the source of a p-channel field effect transistor and the power source VDD and between the source of an n-channel field effect transistor and the power source VSS are reduced in resistance. The p-channel field effect transistor and the n-channel field effect transistor may form a complementary inverter. The power supply lines for the input and output cells may be routed through a lower layer where the power supply lines for the macro-cells are formed. Since the ninth modification has the vacancy 412, the power supply pads are formed in the vacancy 412. The power voltages are supplied to the input and output cells from these power supply pads. However, any signal pad is never formed outside of those power supply pads.

As will be appreciated from the foregoing description, the flip chip semiconductor device according to the present invention has the signal pads arranged outside of the power supply pads. When the manufacturer designs a package substrate to be assembled with the flip chip semiconductor device, the manufacturer reduces the number of layers forming the multi-layered package substrate, because the signal lines are connected to the signal pads on the same level. Thus, the flip chip semiconductor device according to the present invention is advantageous over the prior art flip chip semiconductor devices in the total production cost of the electric system.

Although particular embodiments of the present invention have been shown and described, it will be apparent to those skilled in the art that various changes and modifications may be made without departing from the spirit and scope of the present invention.

For example, the number of input and output cells of the input and output cell groups may be varied on the same chip, and the input and output cells may be spaced from one another. In detail, each input and output cell group has three members in the embodiment shown in FIGS. 3 and 4, and the three input and output cells are contiguous to one another. However, the members of an input and output cells may be different in number from another input and output cells. Moreover, the input and output cells in an input and output cell group may be spaced from one another.

The columns of signal pads 31/33 may be located on either side of the column of signal pads over the column 32 of input and output cell groups 2. Otherwise, the columns of signal pads 31 and 33 may be asymmetrically arranged on both sides of the column of signal pads 32.

The input and output cell groups 2 in a column may be different in number from the input and output cell groups in another column. The input and output cell groups 2 in each column may be contiguous to one another without any gap. The columns of input and output cell groups may be arranged at irregular intervals. In this instance, wiring lines may be formed in a region corresponding to a part of the relatively wide gap between the adjacent columns of input and output cell groups. The interval between the adjacent columns of input and output cell groups may be a multiple different from the multiple of the interval between the adjacent columns of signal pads. The interval between the adjacent columns of input and output cell groups may be wider than the multiple of the interval between the adjacent columns of signal pads.

The number of the signal pads in a column may be less than the number of the input and output cell groups in the associated column. In this instance, a certain signal pad is widely spaced from the adjacent signal pad, and a signal line to the certain signal pad may be routed through the wide area in the pad forming layer.

What is claimed is:

1. A flip chip semiconductor device of a multiplexing-layered structure having a cell forming layer and a pad forming layer, comprising:

input and output cells formed in said cell forming layer together with macro-cells;

power supply pads formed in said pad forming layer, and electrically connected to said input and output cells; and signal pads formed in said pad forming layer, electrically connected to said input and output cells, and only arranged in an area outside of an area of said power supply pads.

2. A flip chip semiconductor device of a multi-layered structure having a cell forming layer and a pad forming layer, comprising:

input and output cells formed in said cell forming layer together with macro-cells;

power supply pads formed in said pad forming layer, and electrically connected to said input and output cells; and signal pads formed in said pad forming layer, electrically connected to said input and output cells, and arranged outside of said power supply pads;

in which said signal pads and said power supply pads are to be connected to corresponding signal pads directly connected to signal lines without passing through a different layer and corresponding power supply pads formed on a pad forming layer of a multi-layered package substrate.

3. A flip chip semiconductor device of a multi-layered structure having a cell forming layer and a pad forming layer, comprising:

input and output cells formed in said cell forming layer together with macro-cells;

power supply pads formed in said pad forming layer, and electrically connected to said input and output cells; and signal pads formed in said pad forming layer, electrically connected to said input and output cells, and arranged outside of said power supply pads;

in which said input and output cells form input and output cell groups which in turn form columns of input and output cell groups extending in directions crossing peripheral edges of said pad forming layer.

4. The flip chip semiconductor device as set forth in claim 3, in which said directions are perpendicular to said peripheral edges of said pad forming layer shaped in a rectangular configuration.

5. The flip chip semiconductor device as set forth in claim 3, in which said signal pads and said power supply pads are to be connected to corresponding signal pads directly connected to signal lines without passing through a different layer and corresponding power supply pads formed on a pad forming layer of a multi-layered package substrate.

6. The flip chip semiconductor device as set forth in claim 3, in which said signal pads form column groups of signal pads respectively associated with said columns of input and output cell groups.

7. The flip chip semiconductor device as set forth in claim 6, in which each of said column groups of signal pads has a column of signal pads located over associated one of said columns of input and output cell groups and other columns of signal pads adjacent to said column of signal pads.

8. The flip chip semiconductor device as set forth in claim 7, in which said other columns of signal pads are symmetrically arranged on both sides of said column of signal pads.

9. The flip chip semiconductor device as set forth in claim 7, in which said other columns of signal pads are asymmetrically arranged with respect to said column of signal pads.

10. The flip chip semiconductor device as set forth in claim 6, in which one of said column groups of signal pads includes a column of signal pads located over associated one of said columns of input and output cell groups and at least one column of signal pads located on either side of said column of signal pads.

11. A flip chip semiconductor device of a multi-layered structure having a cell forming layer and a pad forming layer, comprising:

input and output cells formed in said cell forming layer together with macro-cells;

power supply pads formed in said pad forming layer, and electrically connected to said input and output cells; and signal pads formed in said pad forming layer, electrically connected to said input and output cells, and arranged outside of said power supply pads;

in which said macro-cells are formed inside of said input and output cells.

12. The flip chip semiconductor device as set forth in claim 3, in which said columns of input and output cell groups are spaced from one another so that said macro-cells are arranged in such a manner as to occupy an inner area of said cell forming layer and vacant areas between said columns of input and output cell groups.

13. The flip chip semiconductor device as set forth in claim 3, in which said input and output cell groups are equal in the number of said input and output cells to one another.

14. The flip chip semiconductor device as set forth in claim 3, in which at least one of said input and output cell groups is different in the number of said input and output cells from others of said input and output cell groups.

15. The flip chip semiconductor device as set forth in claim 3, in which said columns of input and output cell groups are equal in the number of said input and output cell groups to one another.

16. The flip chip semiconductor device as set forth in claim 3, in which at least one of said columns of input and output cell groups is different in the number of said input and output cell groups from others of said columns of input and output cell groups.

17. The flip chip semiconductor device as set forth in claim 3, in which at least two of the input and output cells of one of said input and output cell groups are spaced from one another.

18. The flip chip semiconductor device as set forth in claim 3, in which at least one of said input and output cell groups is constituted by only one input and output cell.

19. The flip chip semiconductor device as set forth in claim 3, in which at least one of said input and output cell groups has one of the input and output cells and other input and output cells symmetrically arranged with respect to said one of said input and output cells.

20. The flip chip semiconductor device as set forth in claim 3, in which at least one of said input and output cell groups has one of the input and output cells and other input and output cells asymmetrically arranged with respect to said one of said input and output cells.

21. The flip chip semiconductor device as set forth in claim 3, in which one of said columns of input and output cell groups has the input and output cell groups contiguous to one another.

22. The flip chip semiconductor device as set forth in claim 3, in which one of said columns of input and output cell groups has the input and output cell groups spaced from one another for providing a vacant area assigned to a wiring line.

23. The flip chip semiconductor device as set forth in claim 3, in which the input and output cell groups are removed from at least one of said columns of input and output cell groups so that the macro-cells occupy the vacancy of an area to be assigned to said at least one of said columns of input and output cell groups.

24. The flip chip semiconductor device as set forth in claim 3, in which said columns of input and output cell groups are arranged at regular intervals.

25. The flip chip semiconductor device as set forth in claim 3, in which two of said columns of input and output cell groups are spaced by an interval different from the interval between other two of said columns of input and output cell groups.

26. The flip chip semiconductor device as set forth in claim 3, in which said columns of input and output cell groups are powered through power supply lines connected to said power supply pads through via-holes and extending in parallel thereto.

27. The flip chip semiconductor device as set forth in claim 1, in which the power supply pads connected to said input and output cells are arranged on a virtual closed line extending inside of said signal pads.

28. The flip chip semiconductor device as set forth in claim 27, in which said virtual line outwardly projects at corners of said pad forming layer so as to extend outside of an area of said cell forming layer where said macro-cells occupy.

29. The flip chip semiconductor device as set forth in claim 1, further comprising power supply lines extending on a layer of said multi-layered structure different from said cell forming layer and said pad forming layer and connected at first ends thereof to said input and output cells at second ends thereof to said power supply pads together with power supply lines connected between other power supply pads and said macro-cells.

30. The flip chip semiconductor device as set forth in claim 3, in which one of said input and output cells in one of said input and output cell groups is different in size from other input and output cells in the same input and output cell group.

* * * * *